United States Patent
Lauritzen et al.

(10) Patent No.: US 6,983,437 B2
(45) Date of Patent: Jan. 3, 2006

(54) TIMING VERIFICATION, AUTOMATED MULTICYCLE GENERATION AND VERIFICATION

(75) Inventors: Mogens Lauritzen, Los Altos, CA (US); Gaurav Garg, Sunnyvale, CA (US); Umesh M. Nair, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 156 days.

(21) Appl. No.: 10/702,796

(22) Filed: Nov. 5, 2003

(65) Prior Publication Data

US 2005/0097487 A1 May 5, 2005

(51) Int. Cl.
  *G06F 17/50* (2006.01)
(52) U.S. Cl. .......................... 716/6; 716/18
(58) Field of Classification Search ............ 716/1, 716/3, 4–6, 18
  See application file for complete search history.

(56) References Cited

U.S. PATENT DOCUMENTS

| 5,623,608 | A | 4/1997 | Ng ............................ 395/250 |
| 5,650,938 | A * | 7/1997 | Bootehsaz et al. ............ 716/6 |
| 5,958,027 | A | 9/1999 | Gulick ....................... 710/52 |
| 6,324,678 | B1 * | 11/2001 | Dangelo et al. ............. 716/18 |
| 6,392,747 | B1 | 5/2002 | Allen et al. .............. 356/141.1 |
| 6,550,045 | B1 | 4/2003 | Lu et al. ....................... 716/6 |
| 6,877,139 | B2 * | 4/2005 | Daga ........................... 716/1 |

* cited by examiner

*Primary Examiner*—Vuthe Siek
(74) *Attorney, Agent, or Firm*—Hamilton & Terrile, LLP; Stephen A. Terrile

(57) ABSTRACT

A method for generating consistent functional and timing definitions. The method includes providing a common source description, the common source description corresponding to multicycle paths in an integrated circuit chip design, transforming the common source description to a functional definition, monitoring a functional simulation of the integrated circuit chip design using the functional definition, transforming the common source description to a timing definition, and performing a timing analysis of the integrated circuit chip design using the timing definition.

18 Claims, 5 Drawing Sheets

TIMING VERIFICATION, AUTOMATED MULTICYCLE GENERATION AND VERIFICATION

BACKGROUND OF THE INVENTION

1. Field of the Invention

The present invention relates to the field of integrated circuits and more particularly to timing verification and functional analysis.

2. Description of the Related Art

Known integrated circuit chips contain a large number of transistors and interconnections. Given the large number of devices and ever increasing integrated circuit chip operating frequency, full chip functional verification and full chip timing analysis presents a challenge when designing the integrated circuit chip.

FIG. 1, labeled prior art, shows a block diagram representation of a functional path. The path starts with a register 110 and ends with a register 112. Between the two gates is a functional representation 120 that performs a function on signals passing from the first gate to the second gate. A functional verification confirms that the actual behavior of an integrated circuit design conforms to an integrated circuit chip design specification.

FIG. 2, labeled prior art, shows a block diagram representation of a timing path within an integrated circuit design. The path starts with a register 210 and ends with a register 212. Between the two gates is a timing representation 220 that simulates the timing of the path. Each timing path simulation also includes a resistor capacitor input representation 222 and a resistor capacitor output representation 224 at the input and the output of the timing representation 220. When designing an integrated circuit chip, it becomes important to verify the timing of every path within the chip. The propagation delay of each path should be less than a predefined cycle time.

This design issue becomes even more challenging with the large number of multicycle paths and the process involved in verification of multicycle paths. A single incorrect definition in the timing definition might result in a false timing analysis. The concept of making a path multicycle in high-frequency designs is known. A path is multicycle if the source holds the data valid for n (>1) clock cycles and the destination latches/uses the data at the end nth cycle. Due to the trend of shrinking device sizes, increasing the number of devices on an integrated circuit chip die, increasing the integrated circuit chip die sizes, smaller cycle times and increasing interconnect-delay to gate-delay ratio, multicycle paths present an attractive design choice. This design choice may be especially attractive for interconnect or megacell dominated paths. However, multicycle paths present associated functional simulation and timing verification challenges. Any destination using multicycle path data before the end of an nth cycle can result in a malfunction indication. For this reason, rtl monitors may be placed to verify that data is not used before the nth cycle. Also, multicycle paths should be properly accounted for during static timing analysis to filter out false violations and more importantly to prevent these false violations from masking actual timing violations.

Accordingly, it is important when performing functional simulation and timing verification to ensure the accuracy of functional definitions, the accuracy of multicycle timing definitions and the consistency between functional definitions and timing definitions for a particular integrated circuit chip design.

SUMMARY OF THE INVENTION

In one embodiment, the invention relates to a method for generating consistent functional and timing definitions. The method includes providing a common source description, the common source description corresponding to multicycle paths in an integrated circuit chip design, transforming the common source description to a functional definition, monitoring a functional simulation of the integrated circuit chip design using the functional definition, transforming the common source description to a timing definition, and performing a timing analysis of the integrated circuit chip design using the timing definition.

In another embodiment, the invention relates to a system for generating consistent functional and timing definitions. The system includes a common source description, the common source description corresponding to multicycle paths in an integrated circuit chip design, means for transforming the common source description to a functional definition, means for monitoring a functional simulation of the integrated circuit chip design using the functional definition, means for transforming the common source description to a timing definition, and means for performing a timing analysis of the integrated circuit chip design using the timing definition.

In another embodiment, the invention relates to an apparatus for generating consistent functional and timing definitions. The apparatus includes a common source description, the common source description corresponding to multicycle paths in an integrated circuit chip design, a transforming module, the transforming module transforming the common source description to a functional definition, a monitoring module, the monitoring module monitoring a functional simulation of the integrated circuit chip design using the functional definition, a timing transforming module, the timing transforming module transforming the common source description to a timing definition, and a timing analysis module, the timing analysis module performing a timing analysis of the integrated circuit chip design using the timing definition.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
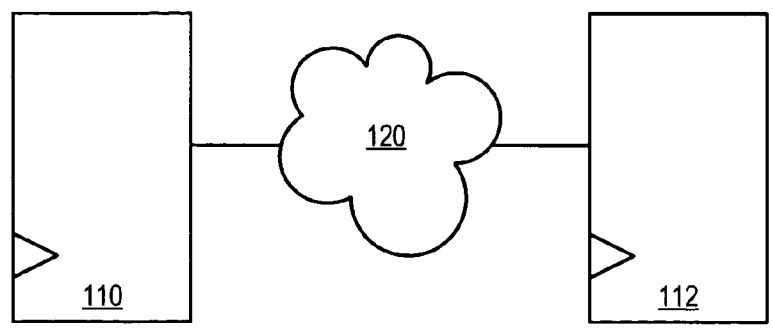
FIG. 1, labeled prior art, shows a block diagram representation of a functional path.
Figure 2:
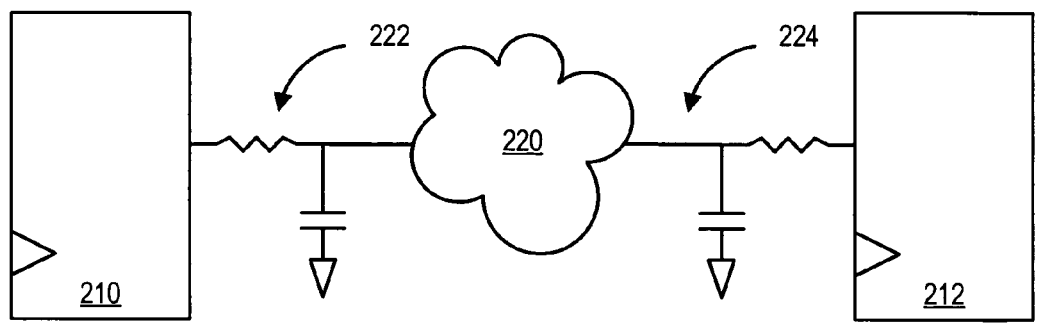
FIG. 2, labeled prior art, shows a block diagram representation of a timing path within an integrated circuit design.
Figure 3:
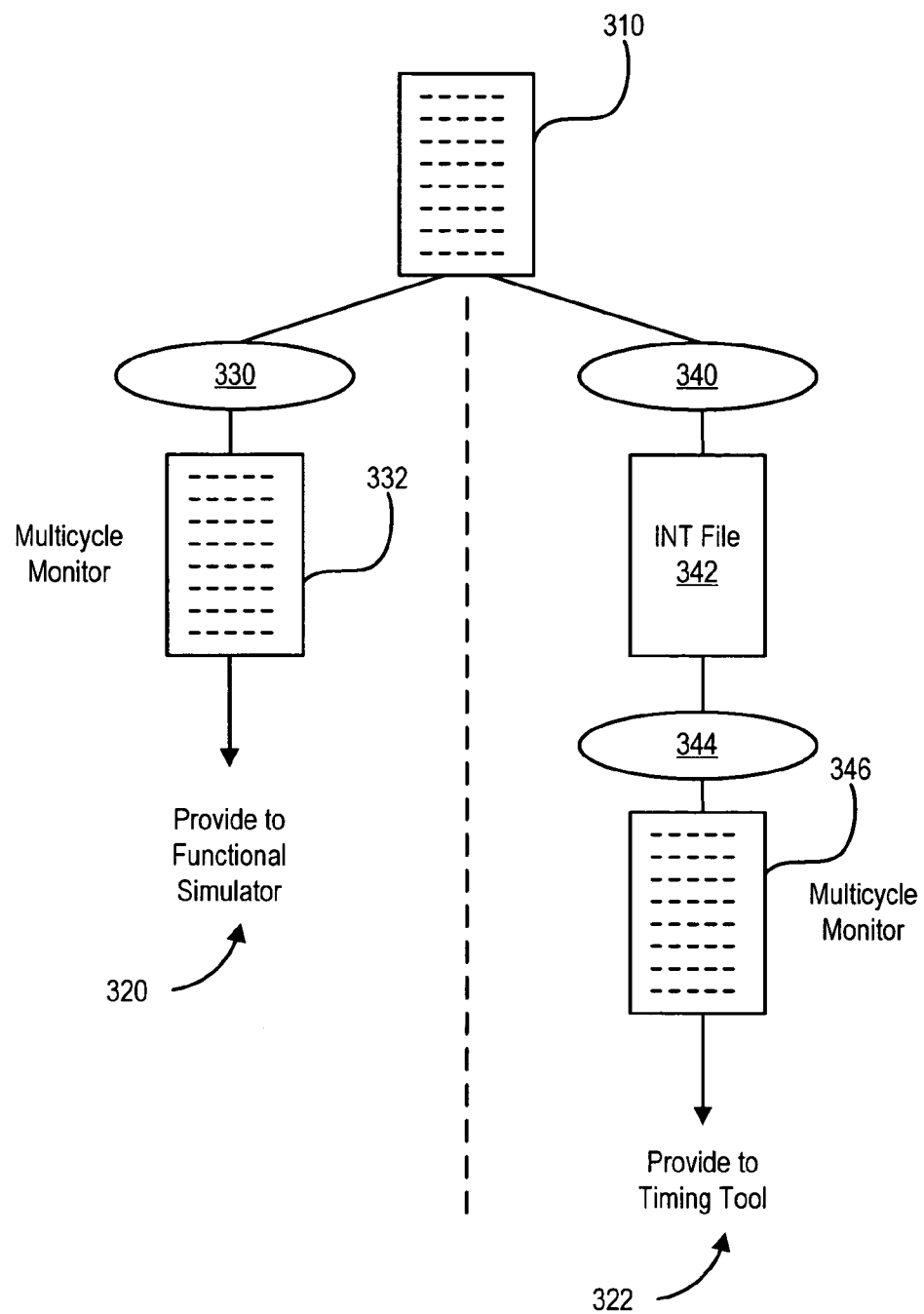
FIG. 3 shows a flow diagram of the operation of a system for generating functional definitions and timing definitions in accordance with the present invention.

Referring to FIG. 3, a flow diagram of the operation of a system for generating consistent functional definitions and timing definitions is shown. The system 300 enables and enhances the design and verification of an integrated circuit chip by facilitating a plurality of functions such as an Register Transfer Level (RTL) verification of multicycle through monitors function, timing verification and generation of multicycles function and a results analysis function.

More specifically, the system for generating consistent functional definitions and timing definitions 300 includes a common source file 310. The common source description 310 is provided by the designers of an integrated circuit chip and sets forth all devices, paths, path source, path destination and interconnections of the integrated circuit chip. The common source description also includes information regarding the number of cycles a certain function should require to complete as well as how to verify a function is working as expected. The common source description also includes an expected result for a particular function. The expected result might include a true value, a false value, an unknown value and a delayed value. Certain signals, such as a reset signal, cannot have an unknown value and so providing a delayed value enables the integrated circuit designer to delay this signal a certain number of cycles while still being able to determine whether the integrated circuit design is functioning as desired. The common source description is set forth in an easy to read, user friendly format. For example, the common source description generally refers to buses without referencing each individual path of a bus, e.g., an address path is referenced as a single path. The common source description 310 is provided to a functional portion 320 and a timing portion 322. For example, in an exemplative integrated circuit design, the common source description 310 might include 50–100 entries.

With the functional portion 320, the common source description 310 is provided to a source to functional transform module 330. The source to functional transform module 330 transforms the common source description 310 into a functional definition 332 such as a multicycle monitor functional definition. The multicycle monitor functional definition 322 is provided to a functional simulator to verify the functionality of an integrated circuit chip corresponding to the common source description 310. I.e., the monitor then watches the results of the functional simulation at each cycle to determine whether the results of the actual functional simulation correspond to the expected results as set for by the functional definition 332. In an exemplative integrated circuit design, the functional definition might set forth approximately 400 functional paths.

In the timing portion 322, the common source description 310 is provided to a source to intermediate timing transform module 340. The source to intermediate timing transform module 340 transforms the common source description 310 into an intermediate timing description 344. The intermediate timing description 342 provides a user friendly description of the timing definitions. For example, the intermediate timing description 342 sets forth block level pins, buses, and timing information in a timing tool format such as the PEARL-like format. The PEARL format corresponds to timing tools such as timing tools available from Cadence Design Systems, Inc. In an exemplative integrated circuit design, the intermediate timing definition might set forth approximately 400 timing paths.

The intermediate timing description 342 is provided to an intermediate to multicycle timing transform module 344. The intermediate to multicycle timing transform module 344 transforms the intermediate timing description 342 to a multicycle timing definition 346. The multicycle timing definition 346 generates definitions for each timing combination. The combinations include trace path to source and destination register, bit blast for buses having a number of parallel bus paths and individual multicycle definitions. In an exemplative integrated circuit design, the timing definition might set forth approximately 28,000 unique timing paths.

The multicycle timing definition 346 is then provided to a timing tool to verify the timing of an integrated circuit chip corresponding to the common source description 310.

Figure 4:
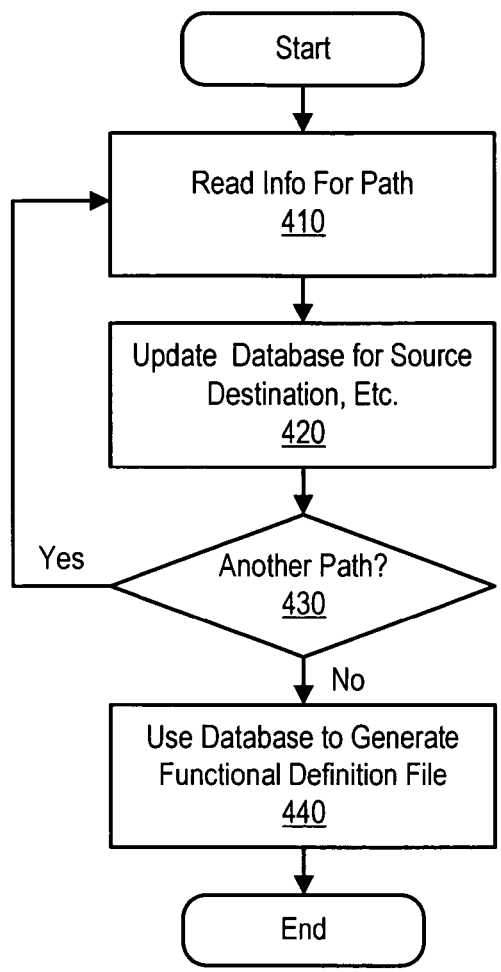
FIG. 4 shows a flow chart of the operation of the source to functional transform module.

Referring to FIG. 4, a flow chart of the operation of the source to functional transform module 330 is shown. More specifically, the functional transform module 330 starts by reading information from the common source definition for a particular path at step 410. Next the functional transform module 330 updates a functional definition database to include information corresponding to the source, destination, number of cycles, etc. for a particular path at step 420. Next the functional transform module 330 determines whether there is another path set forth by the common source definition to transform at step 430. If there is another path, then the functional transform module 330 returns to step 410. If not, then the functional transform module 330 uses the completed database to generate a functional definition file in a format that is understandable by the desired functional verification tool at step 440. For example, the functional definition file might be generated to correspond to a Verilog format. After the functional definition file is generated, then execution of the functional transform module 330 completes.

Figure 5:
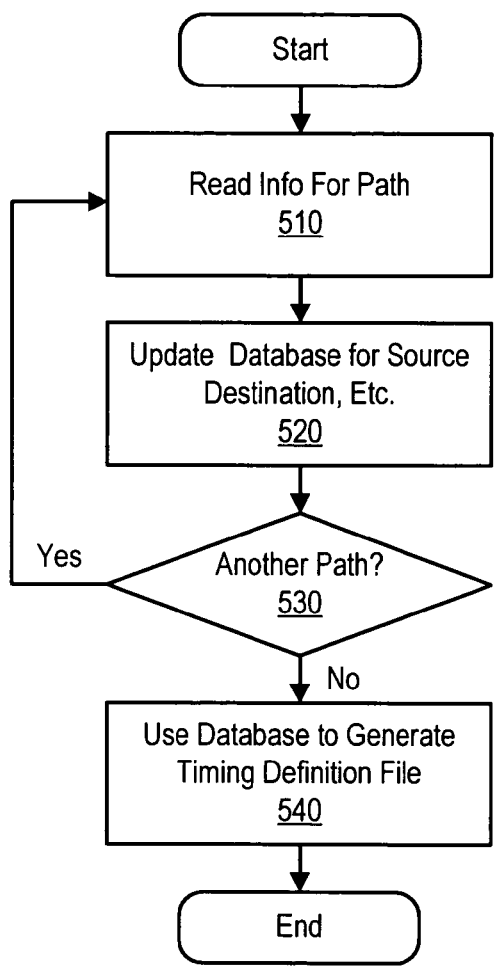
FIG. 5 shows a flow chart of the operation of the source to intermediate timing transform module.

Referring to FIG. 5, a flow chart of the operation of the source to intermediate timing transform module 340 is shown. More specifically, the intermediate timing transform module 340 starts by reading information from the common source definition for a particular path at step 510. Next the intermediate timing transform module 540 updates an intermediate timing definition database to include information corresponding to the source, destination, number of cycles, etc. for a particular path at step 520. Next, the intermediate timing transform module 340 determines whether there is another path set forth by the common source definition to transform at step 530. If there is another path, then the intermediate timing transform module 340 returns to step 510. If not, then the intermediate timing transform module 540 uses the completed database to generate a intermediate timing definition file in a format that is easily understandable at step 340. For example, the intermediate timing definition file might be generated to correspond to a PEARL-like format. I.e., a format in which the syntax is similar to a PEARL format, but that doesn't set forth each and every timing and path detail as a complete PEARL timing definition would. After the intermediate timing definition file is generated, then execution of the intermediate timing transform module 340 completes.

Figure 6:
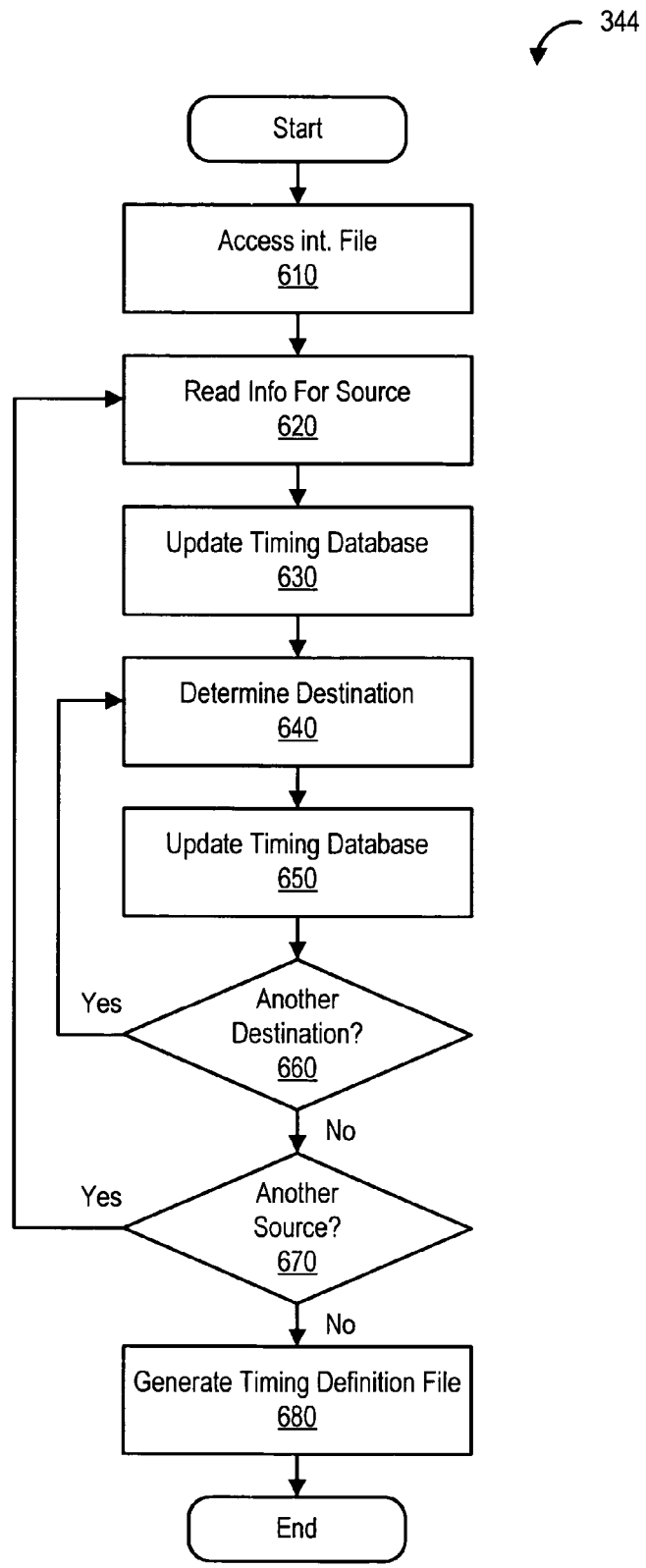
FIG. 6 shows a flow chart of the operation of the intermediate to multicycle timing definition transform module.

Referring to FIG. 6, a flow chart of the operation of the intermediate to multicycle timing definition transform module 344 is shown. More specifically, the intermediate to multicycle timing transform module 344 starts accessing the intermediate timing file 342 at step 610. Next the intermediate to multicycle timing transform module 344 reads information from the intermediate timing definition 342 for a particular source at step 620. Next the intermediate to multicycle timing transform module 344 updates the timing definition database to include information corresponding to the source a particular path at step 630.

Next, the intermediate to multicycle timing transform module 344 determines a destination that for the particular source at step 640. Determining a destination includes expanding out bit blast information to individual source destination combinations for each path within a particular bus. Next, the intermediate to multicycle timing transform module 344 updates the timing database to include the information for the particular source/destination combination, the information includes the source/destination information as well as timing information such as the number of cycles that a particular path should need to complete at step 650. Next, the intermediate to multicycle timing transform module 344 determines whether there is another destination for the particular source set forth by the intermediate timing definition 342 to transform at step 660. If there is another destination, then the multicycle timing transform module 344 returns to step 640 to determine the next destination for the particular source.

If there is not anther destination, then the multicycle timing transform module 344 determines whether there is another source set forth by the intermediate timing definition 342 to transform at step 670. If there is another source, then the intermediate to multicycle timing transform module 344 returns to step 420. If not, then the intermediate to multicycle timing transform module 344 uses the completed database to generate a timing definition file in a format that is understandable by a multicycle timing simulator at step 680. For example, the timing definition file might be generated to correspond to a PEARL format. After the timing definition file is generated, then execution of the intermediate to multicycle timing transform module 344 completes.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Also, for example, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling submodules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method for generating consistent functional and timing definitions comprising:
   providing a common source description, the common source description corresponding to multicycle paths in an integrated circuit chip design;
   transforming the common source description to a functional definition;
   monitoring a functional simulation of the integrated circuit chip design using the functional definition;
   transforming the common source description to a timing definition, the transforming the common source description to the timing definition including
     transforming the common source description to an intermediate timing definition; and,
     transforming the intermediate timing definition to the timing definition; and,
   performing a timing analysis of the integrated circuit chip design using the timing definition.

2. The method of claim 1 wherein:
   the common source description includes information relating to a path within an integrated circuit design.

3. The method of claim 1 wherein:
   the common source description includes information relating to a number of cycles a certain function within the integrated circuit design should require to complete.

4. The method of claim 1 wherein:
   the common source description includes information regarding whether an expected result of a certain function within the integrated circuit design should be forced unknown or delayed.

5. The method of claim 4 wherein:
   the expected result includes a true value, a false value, an unknown value and a delayed value.

6. The method of claim 5 wherein:
   the delayed value corresponds to a reset signal within the common source description.

7. A system for generating consistent functional and timing definitions comprising:
   a common source description, the common source description corresponding to multicycle paths in an integrated circuit chip design;
   means for transforming the common source description to a functional definition;
   means for monitoring a functional simulation of the integrated circuit chip design using the functional definition;
   means for transforming the common source description to a timing definition, the means for transforming the common source description to the timing definition including means for transforming the common source description to an intermediate timing definition; and,
     means for transforming the intermediate timing definition to the timing definition; and,
   means for performing a timing analysis of the integrated circuit chip design using the timing definition.

8. The system of claim 7 wherein:
   the common source description includes information relating to a path within the integrated circuit design.

9. The system of claim 7 wherein:
   the common source description includes information relating to a number of cycles a certain function within the integrated circuit design should require to complete.

10. The system of claim 7 wherein:

the common source description includes information regarding whether an expected result of a certain function within the integrated circuit design should be forced unknown or delayed.

11. The system of claim 10 wherein:

the expected result includes a true value, a false value, an unknown value and a delayed value.

12. The system of claim 11 wherein:

the delayed value corresponds to a reset signal within the common source description.

13. An apparatus for generating consistent functional and timing definitions comprising:

a common source description, the common source description corresponding to multicycle paths in an integrated circuit chip design;

a transforming module, the transforming module transforming the common source description to a functional definition;

a monitoring module, the monitoring module monitoring a functional simulation of the integrated circuit chip design using the functional definition;

a timing transforming module, the timing transforming module transforming the common source description to a timing definition, the timing transforming module including a common source to intermediate timing transforming module, the common source to intermediate timing transforming module transforming the common source description to an intermediate timing definition; and, an intermediate to timing transform module, the intermediate to timing definition transforming module transforming the intermediate timing definition to the timing definition; and, a timing analysis module, the timing analysis module performing a timing analysis of the integrated circuit chip design using the timing definition.

14. The apparatus of claim 13 wherein:

the common source description includes information relating to a path within the integrated circuit design.

15. The apparatus of claim 13 wherein:

the common source description includes information relating to a number of cycles a certain function within the integrated circuit design should require to complete.

16. The apparatus of claim 13 wherein:

the common source description includes information regarding whether an expected result of a certain function within the integrated circuit design should be forced unknown or delayed.

17. The apparatus of claim 16 wherein:

the expected result includes a true value, a false value, an unknown value and a delayed value.

18. The apparatus of claim 17 wherein:

the delayed value corresponds to a reset signal within the common source description.

* * * * *